(12) United States Patent
Donovan et al.

(10) Patent No.: US 10,511,299 B2
(45) Date of Patent: Dec. 17, 2019

(54) GLITCH COMPENSATION IN ELECTRONIC CIRCUITS

(71) Applicant: FIRECOMMS LIMITED, Cork (IE)

(72) Inventors: Colm Donovan, Leap (IE); Ciaran Cahill, Blarney (IE); Patrick Murphy, Cork (IE)

(73) Assignee: FIRECOMMS LIMITED, Cork (IE)

( * ) Notice: Subject to any disclaimer, the term of this patent is extended or adjusted under 35 U.S.C. 154(b) by 0 days.

(21) Appl. No.: 15/759,768

(22) PCT Filed: Sep. 13, 2016

(86) PCT No.: PCT/EP2016/071532
§ 371 (c)(1),
(2) Date: Mar. 13, 2018

(87) PCT Pub. No.: WO2017/046072
PCT Pub. Date: Mar. 23, 2017

(65) Prior Publication Data
US 2019/0052258 A1 Feb. 14, 2019

(30) Foreign Application Priority Data

Sep. 15, 2015 (EP) .................................... 15185220

(51) Int. Cl.
*H05B 33/08* (2006.01)
*H03K 17/14* (2006.01)
(Continued)

(52) U.S. Cl.
CPC ..... *H03K 17/145* (2013.01); *H03K 19/00346* (2013.01); *H03K 19/00369* (2013.01);
(Continued)

(58) Field of Classification Search
None
See application file for complete search history.

(56) References Cited

U.S. PATENT DOCUMENTS 5,736,881 A 4/1998 Ortiz
2013/0320880 A1* 12/2013 Walker ............... H05B 37/02
315/294

(Continued)

FOREIGN PATENT DOCUMENTS

WO 94/26031 A1 11/1994

OTHER PUBLICATIONS

International Search Report issued in PCT/EP2016/071532; dated Dec. 6, 2016.

(Continued)

*Primary Examiner* — Jimmy T Vu
*Assistant Examiner* — Laura Yesildag
(74) *Attorney, Agent, or Firm* — Studebaker & Brackett PC

(57) ABSTRACT

A supply circuit for providing pulses of current has a current source, a reference voltage source for controlling magnitude of the current, and a current switch for controlling whether or not the current passes through a load. Also, there is a switch control signal terminal for controlling the current switch, and glitch compensation elements including at least one capacitance circuit and associated capacitor drive circuit for feeding a variable correcting voltage back to the reference voltage, and a controller to control said variable voltage.

11 Claims, 2 Drawing Sheets

(51) Int. Cl.
  *H03K 19/003*  (2006.01)
  *H03K 17/08*  (2006.01)
(52) U.S. Cl.
  CPC ..... *H05B 33/0815* (2013.01); *H05B 33/0824* (2013.01); *H05B 33/0848* (2013.01); *H05B 33/0887* (2013.01); *H03K 2017/0806* (2013.01)

(56) References Cited

U.S. PATENT DOCUMENTS

2015/0188537 A1* 7/2015 Isoda ................ H03K 19/0185
  327/108
2017/0011696 A1* 1/2017 Kim .................... G09G 3/3648

OTHER PUBLICATIONS

David A. Johns et al.; "MOS Sample-and-Hold Basics"; Analog Integrated Circuit Design; 1997; p. 339, Fig. 8.5; ISBN 0-471-14448-7; John Wiley & Sons, Inc.; USA.
Behzad Razavi; Design of Analog CMOS Integrated Circuits, International Edition; 2001; pp. 415-420 and 515-520; ISBN 0-07-118839-8; McGraw-Hill; New York, NY, USA.

\* cited by examiner

GLITCH COMPENSATION IN ELECTRONIC CIRCUITS

INTRODUCTION

Field of the Invention

This invention relates to electronic circuits used for signal processing, and in particular to circuit modules intended to provide periodic pulses of current of a controlled magnitude, such as in a driver circuit for delivery of control signals to an array of LEDs.

Prior Art Discussion

Many circuits are required to deliver pulses of current for defined periods: One such application is the driving of current to an LED or laser used in a communications system to deliver coded pulses of light into an optical fibre. Typically, a current source, delivers a constant current of magnitude set by a reference voltage, and controls whether or not the current is delivered to the load. The switch is turned on and off by a switch control signal.

Optical communication systems often use a form of Light Emitting Diode (LED) to generate an optical signal. This is done by sending a current into the LED. The light output is proportional to the current in. It is highly desirable to have clean square wave outputs from the LED with no optical distortion (overshoot or undershoot). Optical distortion can cause the next stage optical receiver to experience pulse-width-distortion (PWD) through incorrect calculation of the peak optical signal. PWD can lead to signal loss.

Since the LED in an optical system provides a light output proportional to its current input, a glitch on the voltage source that defines the current into the LED will result in optical distortion. It is therefore desirable to have a glitch-free voltage source in an optical system to prevent optical overshoot or undershoot.

A well-known problem with circuits of such types is that the sudden starting and stopping of the flow of current through the load will cause sudden changes in the voltage level at the output of the switch and these changes can disturb the voltages in nearby components. These voltage fluctuations, or "glitches", can affect the reference voltage supplied to the current source, and cause it to deliver currents with an incorrect magnitude.

It should be noted that the mechanism by which these 'glitches' couple between nodes is through what are known as 'parasitic capacitances'. In a common MOS device for example, there are well known parasitic capacitors between the gate, drain, and source nodes. These parasitic capacitors typically have a proportionality to the size of the devices. For example a 100 µm/0.35 µm NMOS would have approximately ten times the parasitic gate-drain capacitance as a 10 µm/0.35 µm NMOS device.

A known approach to compensating for these glitches employs an inverting amplifier (such as described in Analog Integrated Circuit Design, P339 FIG. 8.5, ISBN 0-471-14448-7, David A. Johns, Ken Martin) and a capacitor. These additional components add a correcting voltage onto the reference voltage supplied to the current source. As this correcting voltage is controlled by the same signal as is controlling the switch, it will approximately match the timing of the voltage changes caused by the switching action, and the gain of the amplifier and the magnitude of the capacitor may be set so as to provide a correction of the appropriate magnitude. However, even with such a circuit, some glitch problems may remain. The overall supply voltage to the circuit may vary, the characteristics of the output load may vary (for example if it heats up in operation or the ambient temperature changes) or the desired reference voltage may be altered by the normal operation of some other part of the circuit. Any of these changes may alter the magnitude of the interference glitch, or the time at which the glitch arrives, and hence reduce the effectiveness of any correction circuit.

Another field in which glitch compensation (or 'charge' compensation) is common is converters, Digital-To-Analog converters (DACs), or Analog-To-Digital Converters (ADCs). In order to compensate for a glitch disturbance, a quantity of charge is injected to the node of interest through a compensation capacitor driven by an open loop amplifier or inverter. However, this is not optimum for many applications such as driving LEDs. It neither exerts adequate control over the charge applied, nor suitably accounts for the operating conditions of the circuit.

One approach to improve the robustness of a voltage source to glitches is to increase the power used to generate the voltage source. In the case of using a current mirror as a voltage source this usually means increasing the current into the mirror device to increase the bandwidth of the node. However, it is preferred to reduce the power requirements of circuits, so this is undesirable. It will also be impossible to remove the glitch completely, so further glitch reduction circuitry may be required.

Another way to improve the robustness of a voltage source to glitches is to filter glitches with large capacitors. The reduction of the glitch will be proportional to the size of the filter capacitor used. In the case of integrated circuits, capacitors can require a large silicon area. However, this increases the cost of circuits, and so is undesirable. Since the glitch reduction is proportional to the capacitor size then an acceptable capacitor size may be used to make some limited improvements in conjunction with further glitch reduction circuitry.

Glitches on a voltage source can also be reduced by using a method called 'current steering', such as described in Design Of Analog CMOS Integrated Circuits, International Edition, P515-520, Behzad Razavi, 2001, ISBN 0-07-118839-8.

This method reduces the glitch on the voltage source because it never turns the current output off. Instead, a complementary switch redirects the current to a supply rail or to a dummy load. The main disadvantage of this technique is that the average current output is doubled, because instead of being switched off half the time the current is always on. Also this method does not completely remove the glitch because perfect current steering is impossible, and further glitch reduction circuitry may still be required.

The invention is directed towards achieving improved glitch compensation especially for communication applications.

SUMMARY OF THE INVENTION

According to the invention, there is provided a supply circuit for providing pulses of current, the circuit comprising a current source, a reference voltage source for controlling magnitude of current delivered by the current source, a current switch for controlling whether or not said current passes through a load, a switch control signal terminal for controlling the current switch, and glitch compensation elements including at least one capacitor and associated drive circuit for feeding a variable correcting voltage to the reference voltage source, and a controller to control said correcting voltage in response to one or more parameters of the circuit.

In one embodiment, the glitch compensation elements comprise a plurality of drive elements, each connected in series with a capacitor for feeding a correcting voltage back to the reference voltage, the number of drive elements to operate at any time being dependant on an output of the controller.

In one embodiment, the glitch compensation elements comprise a plurality of capacitors, and at least one of said capacitors is connected into the reference voltage source or disconnected from it by a switch controlled by the controller.

In one embodiment, a glitch compensation element is configured to disable a capacitor, for example by disabling a drive element.

In another embodiment, the glitch compensation elements comprise at least one delay element and the controller is configured to time said feeding of a correcting voltage by control of said delay element according to a target of correcting voltage charge being coincident in time, and equal in magnitude, and of opposite polarity to a glitch-causing parasitic charge.

In a further embodiment, said delay element comprises a series of inverters and/or a resistor and capacitor circuit.

A parameter may be supply voltage provided to the circuit and/or temperature at which the circuit is operating and/or output drive current set for the circuit module and/or voltage detected on the load.

In one embodiment, the controller is configured to respond to more than one parameter and to combine these parameters according to an algorithm.

In another aspect, the invention provides a drive circuit for a communication system, comprising a supply circuit of any embodiment. The drive circuit may comprise LED drive components driven by the supply circuit.

Additional Statements

According to the invention, there is provided a circuit for providing pulses of current, the circuit comprising a current source, a reference voltage source for controlling magnitude of the current, a current switch for controlling whether or not the current passes through a load, a switch control signal terminal for controlling the current switch, and glitch compensation elements including at least one variable capacitance circuit for feeding a correcting voltage back to the reference voltage, and a controller to control said variable capacitor.

In one embodiment, the controller is configured to control said capacitance in response to a parameter of the circuit.

In one embodiment, the controller is configured to respond to the supply voltage provided to the circuit.

In one embodiment, the controller is configured to respond to the temperature at which the circuit is operating.

In one embodiment, the controller is configured to respond to the output drive current set for the circuit module.

In one embodiment, the controller is configured to respond to voltage detected on the load.

In one embodiment, the control element is configured to respond to more than one parameter and to combine these parameters according to a formula or algorithm.

In one embodiment, the glitch compensation elements comprise multiple drive elements, each connected in series with a capacitor for feeding a correcting voltage back to the reference voltage, the number of drive elements to operate at any time being dependant on an output of the controller.

In one embodiment, the glitch control elements comprise a plurality of capacitors, and at least one of said capacitors is connected into the circuit or disconnected from it by a switch controlled by the controller.

In one embodiment, a switch element is configured to disable a capacitor, for example by disabling a drive element.

In another aspect, the invention provides a circuit as defined above, implemented as part of an integrated circuit designed to provide a drive current for a light emitting element as part of a communications system.

In another aspect, the invention provides a drive circuit for a communication system, comprising a circuit as defined above in any embodiment.

DETAILED DESCRIPTION OF THE INVENTION

Brief Description of the Drawings

The invention will be more clearly understood from the following description of some embodiments thereof, given by way of example only with reference to the accompanying drawings in which:—

DESCRIPTION OF THE EMBODIMENTS

A circuit provides current pulses and a delay element, and one or more glitch compensation elements are made variable and controlled by a control element taking into account one or more parameters available to the control element. In some embodiments, there may be multiple similar elements with the control taking the form of connecting or disconnecting one or more of the similar elements.

In the invention glitch compensation elements vary a correcting charge on a bank of one or more capacitors, to dynamically apply a correcting voltage to the reference voltage source in response to a glitch disturbance. The compensation elements target this charge to be equal in magnitude, equal in time of application, and of opposite polarity to the charge from the glitch disturbance, thereby cancelling the disturbance. In various embodiments there are different means of varying the quantity of glitch compensation charge. One mechanism employs a variable capacitance configured by digital control, and another employs a mechanism to enable or disable several fixed capacitors in parallel. It will be appreciated there may be many other means of creating a variable capacitance. Another mechanism to vary the glitch compensation charge is through controlling a capacitor drive circuit, by for example, altering the maximum and minimum voltages applied by the capacitor drive circuit.

Figure 1:
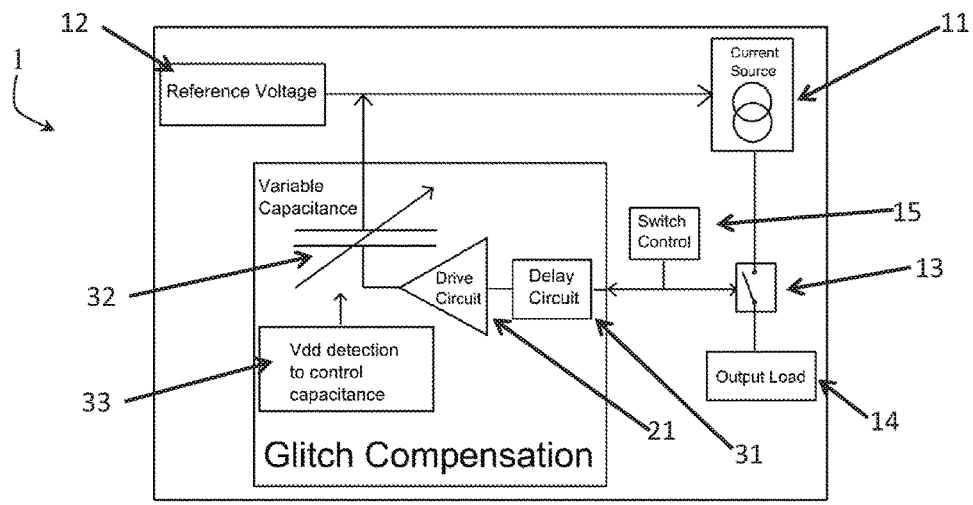
FIG. 1 is a circuit diagram of a glitch compensation circuit of the invention.

Referring to FIG. 1 a supply circuit 1 has a current source 11, a reference voltage 12, a current switch 13, an output load 14, a switch control 15, and an amplifier drive circuit 21. Also, there is a delay element 31, a variable capacitor 32, and a capacitor controller 33.

The purpose of the delay element 31 is to compensate for delays elsewhere in the circuit, so that the correcting voltage to be applied by the glitch compensation elements arrives at the same time as the interference glitch. It should be appreciated that the change of voltage on the load due to the supplied current will take a finite amount of time, proportional to characteristics of the load and the current supplied. This time may vary depending on the load characteristics or the circuit conditions. If the correcting voltage applied by the glitch compensation element were to arrive much faster than the glitch caused by the changing voltage on the load it would not initially cancel the glitch, and could in fact act as an undesired glitch itself.

A delay element may be required to ensure that timing of the glitch compensation elements and the glitch itself coincide more closely. A delay element may comprise of a chain of inverters, or perhaps simply a resistor and capacitor. It should also be appreciated there may be conditions where the voltage response of the load to the current supplied is very fast, for which optimum glitch compensation requires that this delay be zero, and thus the delay element 31 may be omitted. It will be appreciated that the drawings show the delay elements 31 in FIG. 1 (and 41 in FIG. 2, as set out in detail below) connected between the switch control 15 and the glitch compensation amplifier 21 or glitch compensation drive circuit 42, but this will not always be optimum. If, in a particular case, it is found that the natural circuit delays are greater on the glitch compensation side of the circuit than they are on the output side of the circuit, it may be appropriate that the delay element be inserted between the switch control and the current switch.

The capacitor control element 33 measures the supply voltage ($V_{dd}$) supplied to the circuit 1 and outputs a signal which controls the variable capacitor 32 accordingly. A method of monitoring Vdd is a simple Analog-To-Digital Converter (ADC) as part of the same integrated circuit.

In the simplest case, FIG. 1 might be reduced to a single drive element with a pair of capacitors, one of which is always connected, and the other of which is connected or disconnected as required by a signal switch controlled by a glitch control element.

Figure 3:
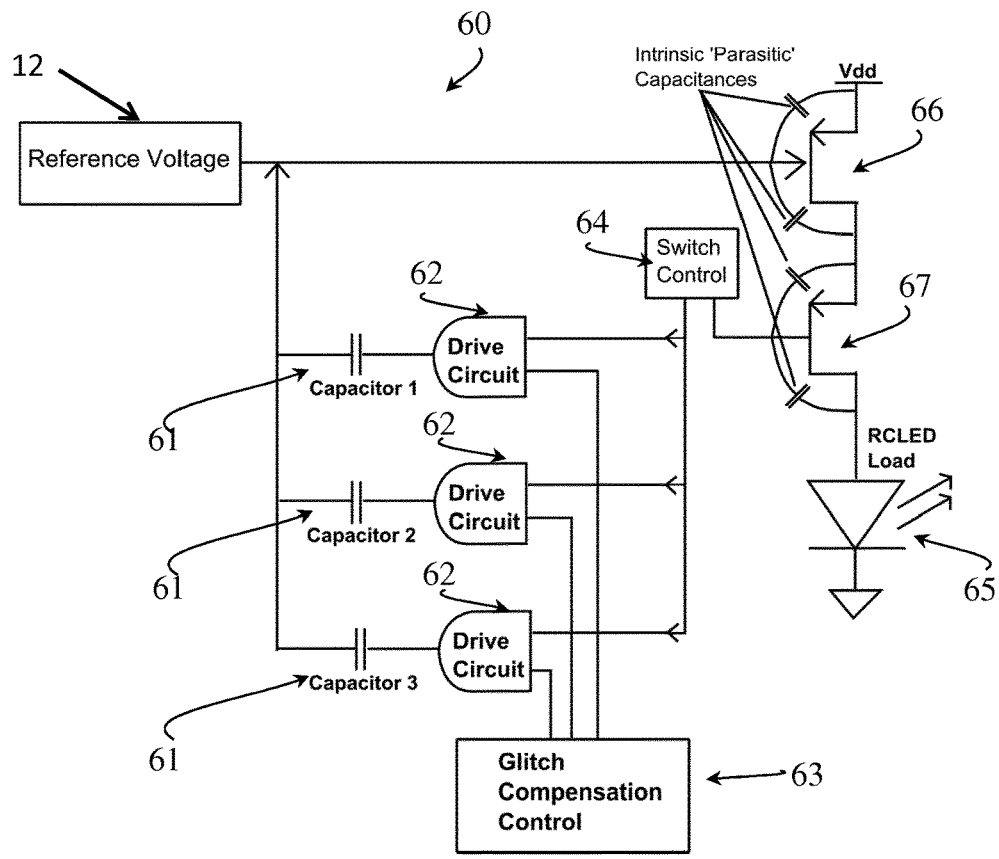
FIG. 3 is a diagram of an alternative glitch compensation circuit.

It is common practice to design integrated circuits to be suitable for operating at different voltages, for example at 3.3 Volts or 5.0 Volts, because one or other of these voltages are commonly used in electrical equipment, and it is more economical to have one integrated circuit in mass production that will work at both voltages than to produce smaller volumes of two different integrated circuits each designed for a specific voltage. In the circuit of FIG. 3 the drive elements are coupled to the voltage supply Vdd. If the Vdd changes then so does the correcting voltage applied (the charge on a capacitor is equal to the voltage multiplied by the capacitance). So, this scheme of varying the capacitor can allow the glitch compensation circuit to work optimally at both voltages.

Figure 2:
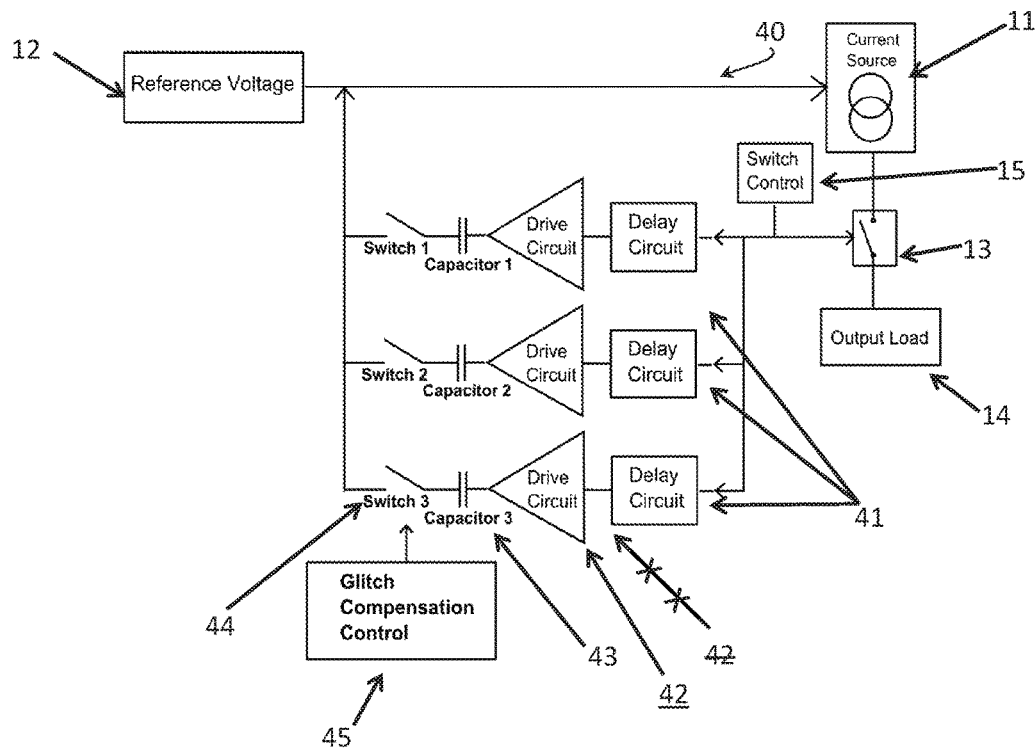
FIG. 2 a circuit diagram of an alternative glitch compensation circuit, in which there are multiple glitch compensation paths which are switched by a control circuit according to measured parameters.

An alternative supply circuit 40 is shown in FIG. 2. In this circuit there are a current source 11, a reference voltage 12, a current switch 13, an output load 14 and a switch control 15. The circuit 40 additionally has a multiplicity of delay elements 41, drive amplifiers 42, capacitors 43, and signal switches 44. While the elements of each type are similar they need not be identical: For example, it may be appropriate that capacitor 2 should have twice the capacitance of capacitor 1, and that capacitor 3 should have double the capacitance of capacitor 2. The glitch compensation control circuit 45 operates the signal switches 44 according to information available to it about the circuit operating conditions, such as supply voltage or temperature, so that the appropriate glitch correcting signal is applied at all times.

TABLE 1

Example control of switches 44 by circuit 45 on supply voltage in FIG. 2.

| Supply Voltage (V) | SW1 | SW2 | SW3 |
|---|---|---|---|
| 3 | CLOSED | OPEN | OPEN |
| 4 | CLOSED | CLOSED | OPEN |
| 5 | CLOSED | CLOSED | CLOSED |

FIG. 2 shows multiple components of each type in the glitch compensation section, but it may not be necessary to duplicate them all. For example, it may be possible to use a single delay element, a single drive amplifier and multiple capacitors, each connected if required by a switch.

A further example is shown in FIG. 3. and comprises a PMOS current source device 66, a reference voltage source 12 at the gate of this PMOS device for controlling magnitude of the current, a current switch comprising another PMOS device 67 for controlling whether or not the current passes through a load, a load comprising of a resonant cavity LED 65, a switch control signal terminal 64 for controlling the current switch and drive circuits, and glitch compensation elements consisting of three capacitors 61, and three capacitor drive circuits 62 comprising of logic gates, and a controller 63 for providing an enable signal to the logic gates. The enable signal to these logic gates would be analogous to the use of switches 44 in FIG. 2. These logic gates would have their power supplies tied to those of the chip, but if desired a different regulated supply could be used, the regulation of this supply itself being a mechanism whereby the glitch compensation could be controlled. If we assume in this example the intrinsic parasitic capacitors of the PMOS devices are of the order of 1 pF, then the three capacitors may be of a similar order of magnitude. As an example they could be binary weighted as 1 pF, 0.5 pf, and 0.25 pF to allow 0.25 pF step adjustments of the compensation capacitance from 0.25 pF up to 1.75 pF.

Figure 4:
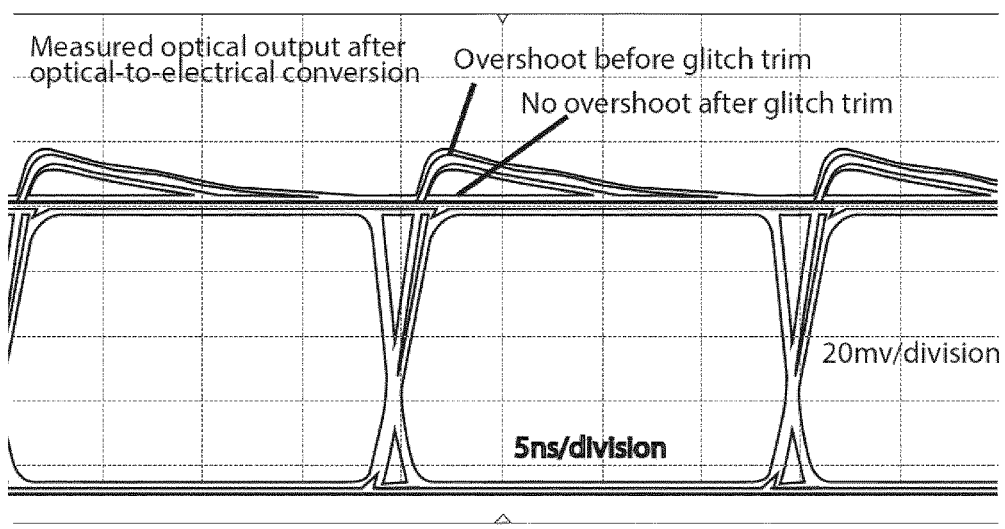
FIG. 4 is a plot of output of the circuit of FIG. 3 with and without glitch compensation, for comparison.

FIG. 4 shows oscilloscope measurements of a working example of an embodiment of the circuit of FIG. 3. Two cases are superimposed on the same axis. The first case is a measurement of the optical output, after optical-to-electrical conversion, of an LED being driven by a current being switched on and off in an embodiment in which the glitch compensation is disabled. This first case shows considerable overshoot of the optical signal due to disturbances of the voltage reference to the current source. This overshoot can be problematic for a receiver trying to detect an accurate signal level. The second case, superimposed on the first, shows the effect of the glitch compensation circuitry removing the overshoot from the optical signal, providing a much more desirable signal to an optical receiver.

It will be appreciated that, apart from the supply voltage, there may be other parameters which affect the nature of the glitch control signal required. For example, it is common that, to compensate for the reduction in efficiency of LEDs at higher temperatures, an LED drive circuit may measure the ambient temperature and alter the reference voltage supplied to the current source at higher temperatures so as to increase the current supplied to the LED. Even with a constant supply voltage, it may be appropriate to change the glitch compensation circuit at higher temperatures or output currents. The glitch compensation control circuit 45 may respond to two or more inputs, apply an appropriate function to each input, sum the result to achieve a composite input and modify the glitch control elements according to this composite input.

As an example, if a 100 mA output is switched into a 10 ohm load, the voltage on the load toggles between 0V and 1V. If, because of the size of the elements used, the glitch charge on the voltage source due to the switching is 3 picocoulombs (pC) then the compensation charge must be equal to this. If the output current is programmed to double to 200 mA then the glitch charge would also approximately double to 6 pC and the compensation charge must vary accordingly. If the circuit is operated at 3V, and the drive elements switch the compensation capacitance between the supply and ground, a 1 pF capacitance will result in a 3 pC compensation charge, and will compensate the case of the output current equal to 100 mA. If the supply now changes to 5V this is no longer the case, and the correct compensation capacitance will be need to be 0.6 pF to supply the necessary 3 pC. In the case of the output current equal to 200 mA rather than 100 mA the correct capacitance for the 3V supply case is 2 pF, and the correct capacitance for the 5V supply case is 1.2 pF. The invention described can use the supplied information (Vdd supply and output current) to calculate the optimum compensation required.

The invention is not limited to the embodiments described but may be varied in construction and detail.

The invention claimed is:

1. A supply circuit for providing pulses of current, said supply circuit comprising:
   a current source,
   a reference voltage source for controlling magnitude of current delivered by said current source,
   a current switch for controlling whether or not said current passes through a load,
   a switch controller for controlling the current switch, and glitch compensation elements comprising:
      a plurality of capacitors configured to apply a correcting charge to the reference voltage source in response to switching on said current switch;
      at least one drive element for delivering correcting charges to said capacitors; and
      a glitch compensation controller configured to control said correcting charge in response to one or more parameters of the supply circuit by:
         enabling or disabling said capacitors, or by
         controlling said drive elements to alter maximum and minimum charge applied by the drive elements to the capacitors, said correcting charge being coincident in time, and equal in magnitude, and of opposite polarity to a glitch-causing parasitic charge.

2. The supply circuit as claimed in claim 1, wherein at least one of said capacitors is connected to the reference voltage source or disconnected from it by a capacitor switch and said glitch compensation controller is configured to enable or disable said capacitors by control of said capacitor switch or switches.

3. The supply circuit as claimed in claim 1, wherein the glitch compensation controller is configured to enable or disable one or more of said a capacitors by enabling or disabling a drive element.

4. The supply circuit as claimed in claim 1, wherein the glitch compensation elements comprise at least one delay element and the glitch compensation controller is configured to time said feeding of a correcting charge by control of said delay element according to a target of the correcting charge being coincident in time, and equal in magnitude, and of opposite polarity to a glitch-causing parasitic charge.

5. The supply circuit as claimed in claim 1, wherein the glitch compensation elements comprise at least one delay element and the glitch compensation controller is configured to time said feeding of a correcting charge by control of said delay element according to a target of correcting voltage charge being coincident in time, and equal in magnitude, and of opposite polarity to a glitch-causing parasitic charge; and wherein said delay element comprises a series of inverters and/or a resistor and capacitor circuit.

6. The supply circuit as claimed in claim 1, wherein a parameter is supply voltage provided to the circuit.

7. The supply circuit as claimed in claim 1, wherein a parameter is temperature at which the circuit is operating.

8. The supply circuit as claimed in claim 1, wherein a parameter is output drive current set for the circuit module.

9. The supply circuit as claimed in claim 1, wherein a parameter is voltage detected on the load.

10. A drive circuit for a communication system, comprising a supply circuit, said supply circuit comprising:
    a current source,
    a reference voltage source for controlling magnitude of current delivered by said current source;
    a current switch for controlling whether or not said current passes through a load,
    a switch controller for controlling the current switch, and glitch compensation elements comprising:
    a plurality of capacitors configured to apply a correcting charge to the reference voltage source in response to switching on said current switch;
    at least one drive element for delivering correcting charges to said capacitors; and
    a glitch compensation controller configured to control said correcting charge in response to one or more parameters of the supply circuit by:
       enabling or disabling said capacitors, or by controlling said drive elements to alter maximum and minimum charge applied by the drive elements to the capacitors,
       said correcting charge being coincident in time, and equal in magnitude, and of opposite polarity to a glitch-causing parasitic charge.

11. The drive circuit as claimed in claim 10, comprising LED drive components driven by the supply circuit.

* * * * *